United States Patent [19]
Berger

[11] Patent Number: 5,835,425
[45] Date of Patent: Nov. 10, 1998

[54] DIMENSION PROGRAMMABLE FUSEBANKS AND METHODS FOR MAKING THE SAME

[75] Inventor: Christian A. Berger, Munich, Germany

[73] Assignee: Siemens Aktiengesellschaft, Munich, Germany

[21] Appl. No.: 923,459

[22] Filed: Sep. 4, 1997

[51] Int. Cl.⁶ ............................................. G11C 7/00
[52] U.S. Cl. ................... 365/200; 365/225.7; 365/63
[58] Field of Search ............................ 365/200, 225.7, 365/63

[56] References Cited

U.S. PATENT DOCUMENTS

| | | | |
|---|---|---|---|
| 5,465,234 | 11/1995 | Hannai | 365/200 |
| 5,487,040 | 1/1996 | Sukegawa et al. | 365/200 |
| 5,633,826 | 5/1997 | Tsukada | 365/200 |

*Primary Examiner*—Vu A. Le
*Attorney, Agent, or Firm*—Stanton C. Braden

[57] ABSTRACT

Disclosed is a repairable semiconductor memory array. The repairable semiconductor memory array includes a main memory array 210. A set of redundant rows 212 and a set of redundant columns 214 for repairing a row element or a column element of the main memory array. A fusebank group 216 that is electrically wired to the set of redundant rows and the set of redundant columns. The repairable semiconductor memory array further includes a plurality of fusebanks 218 contained within the fusebank group. Each of the plurality of fusebanks are programmable to address the column element or the row element of the main memory array, and the addressed column element or row element being replaced with one of the set of redundant rows or one of the set of redundant columns.

15 Claims, 3 Drawing Sheets

DIMENSION PROGRAMMABLE FUSEBANKS AND METHODS FOR MAKING THE SAME

BACKGROUND OF THE INVENTION

1. Field of the Invention

The present relates to the design and manufacture of semiconductor devices. More particularly, the present invention relates to improved techniques for increasing circuit density in a memory circuit.

2. Description of the Related Art

In a memory circuit, e.g., a dynamic random access memory or a field programmable logic device, the memory cells are typically arranged in rows and columns for addressing purposes. By way of example, a typical dynamic random access memory (DRAM) chip may have up to 64 million cells, which may be arranged in rows and columns to be addressed by word lines and bit lines. Dynamic random access memory circuits and designs therefor are well known in the art and will not be discussed in detail here.

During the manufacture of a typical DRAM chip, one or more of the millions of cells in the main array may be found to be defective. Instead of discarding the entire chip, designers in the past have provided redundant cells on the chip, which may be substituted in for the defective cells, thereby bypassing the defective cells and allowing the memory circuit to be used as if there were no defects.

More specifically, when a cell in the main memory array is found to be defective during manufacturing, the entire row or column that contains the defective cell is usually replaced by a redundant row or column. For ease of reference, the entire row or column of cells is referred to herein as an "element." Also, for background purposes, the discussion herein will be made with reference to rows and the replacement thereof, although it should be borne in mind that the issues discussed herein apply equally well to columns and their replacement.

When a redundant element is used to replace a defective element in the main 30 array, the prior art technique of replacement involves setting an enable fuse of the redundant circuit during manufacturing to indicate that the redundant element is to be employed instead of one of the main array elements. The address of the defective main array element that is replaced by that redundant element is also specified during manufacture by setting address fuses of that redundant circuit.

During run time, the values of the enable fuse and address fuses are loaded into an enable latch and address latches respectively. If the enable latch contains the value signifying that the redundant element should be used, that redundant element will be used in place of the defective main array element whose address is specified by the address latches. By way of example, FIG. 1A illustrates a highly simplified DRAM cell 10 having a main array 14. Main array 14 is shown having only 4 rows or elements (0–3) to facilitate ease of discussion although a main array in reality typically has many more elements. There is also shown a redundant element 16, which may be used to replace any of elements 0–3.

FIG. 1B shows an independently repairable block 100 having a number of redundant row and column elements. In practice, DRAM chips are typically segmented into several independently repairable blocks 100, each having a set of redundant row elements 112 and a set of redundant column elements 114 that may be used to replace one or more to the rows or columns of a main memory array block 110. By way of example, assume that the main memory array block 110 contains 256 row elements and 64 column elements. In accordance with this assumption, at least 8 fuse bits (i.e., $2^8=256$) will be needed to address the rows, and at least 6 fuse bits (i.e., $2^6=64$) will be needed to address the columns. For this reason, a fuse bank group 116 is required to have column specific fuses 118b for each redundant column 114', as well as row specific fuses 118a for each redundant row 112'. The fusebank group 116 will therefore have a total of 12 fusebanks (4 fusebanks 118b for the columns and 8 fusebanks 118a for the rows) that may be implemented to replace element failures in the main memory array block 110.

While the prior art technique described in connection with FIGS. 1A and 1B work adequately well to replace defective main array elements, there are disadvantages. By way of example, as DRAM cells increase in capacity, there exists a need to put a greater number of main array memory elements into a chip of a given size. Although fusebanks are essential to the efficient repairability of memory devices such as DRAMs, the shear number of row/column specific fusebanks needed to repair possible failures in the main memory array block 110 also contribute to increased chip sizes. In practice, however, designers have noticed that about 50% of the available redundant row and column elements remain unused after manufacturing repairs are completed. Consequently, a large degree of unused fusebanks 118a and 118b that are associated with the fusebank group 116 will merely occupy very valuable chip space. As is well known, in the highly price competitive DRAM market, every percent of wasted chip space may cost manufacturing companies millions of dollars in lost profits, because fewer chips can be manufactured from each semiconductor wafer.

In view of the foregoing, there is a need for programmable fusebanks that will mitigate the number of unused row/column specific fusebanks in a repairable memory block. Accordingly, it will also be desirable to decrease the number of fusebanks while providing flexible and reliable repairability of defective memory array elements with existing redundant elements.

SUMMARY OF THE INVENTION

Broadly speaking, the present invention fills these needs by providing fewer programmable fusebanks that may be implemented to address either a redundant row element or a redundant column element while simultaneously reducing chip space. It should be appreciated that the present invention can be implemented in numerous ways, including as a process, an apparatus, a system, a device, or a method. Several inventive embodiments of the present invention are described below.

In one embodiment, a repairable semiconductor memory array is disclosed. The repairable semiconductor memory array includes a main memory array. A set of redundant rows and a set of redundant columns for repairing a row element or a column element of the main memory array. A fusebank group that is electrically wired to the set of redundant rows and the set of redundant columns. The repairable semiconductor memory array further includes a plurality of fusebanks contained within the fusebank group. Each of the plurality of fusebanks are programmable to address the column element or the row element of the main memory array, and the addressed column element or row element being replaced with one row of the set of redundant rows or one column of the set of redundant columns.

In another embodiment, a method for making a repairable semiconductor memory array is disclosed. The method includes providing a main memory array having a plurality of row elements and a plurality of column elements. Providing a plurality of redundant row elements and a plurality of redundant column elements for repairing a failed one of the plurality of row elements and the plurality of column elements. The method further includes replacing an addressed one of either the plurality of column elements or one of the plurality of row elements of the main memory array with at least one of the redundant rows or at least one of the redundant columns. The addressed one being selected by programming a fusebank that is wired to both the plurality of redundant row elements and the plurality of redundant column elements.

In yet another embodiment, a repairable memory array including a main memory array, a set of redundant rows elements and a set of redundant column elements for repairing a row element or a column element of the main memory array is disclosed. The repairable memory array includes a fusebank group means that is electrically coupled to the set of redundant rows and the set of redundant columns. The repairable memory array also includes a plurality of fusebank means that are contained within the fusebank group means. Each of the plurality of fusebank means are programmable to address one of the column element or the row element of the main memory array. The addressed one of the column element and the row element being bypassed with one of the set of redundant row elements or one of the set of redundant column elements.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

An invention for programmable fusebanks that may be implemented to address either a redundant row element or a redundant column element while simultaneously reducing chip space is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2A:
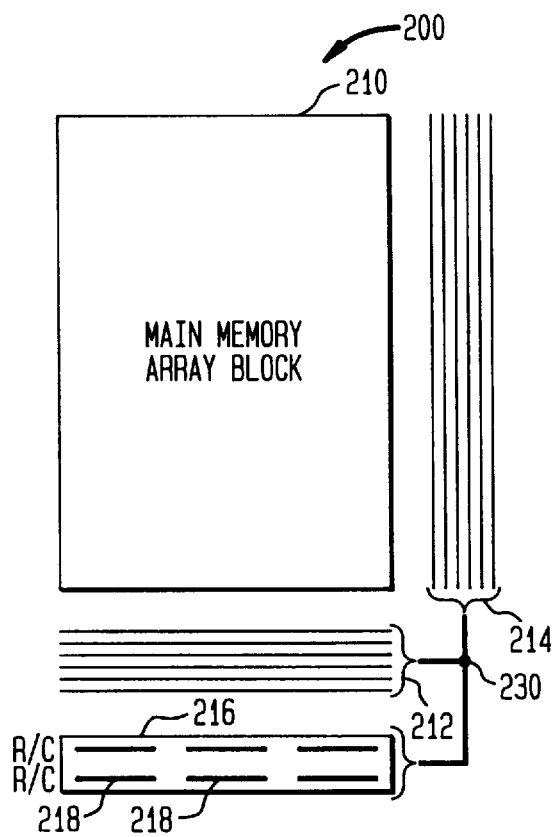
FIG. 2A is a block diagram of an independently repairable memory block in accordance with one embodiment of the present invention.

FIG. 2A is a block diagram of an independently repairable memory block 200 in accordance with one embodiment of the present invention. As shown, a main memory array block 210, which for example, is random access memory (RAM) including dynamic RAM (DRAM), Synchronous DRAM (SDRAM), or any other memory array, is provided with a set of redundant column elements 214 and a set of redundant row elements 212. As is well known, the redundant elements are generally used to replace an element of the main memory array block 210 when a defect is detected in a selected memory cell. Illustratively, a compact fusebank group 216 is provided having six programmable fuse banks 218 that are coupled to a selection node 230. Selection node 230 is then connected to both the set of redundant column elements 214 and the set of redundant row elements 212.

Because the programmable fusebanks 218 contained within the compact fusebank group 216 are coupled to both the set of redundant column elements 214 and the set of redundant row elements 212, each of the programmable fusebanks 218 may be coded to replace either a row or a column of the main memory array block 210 with one of the set of redundant column elements 214 or one of the set of redundant row elements 212. To effectuate the selection of the element to be replaced within the main memory array block 210, the programmable fusebanks 218 preferably have a dimension fuse that transforms the programmable fusebank 218 into a row or column specific fusebank. As such, all of the programmable fusebanks 218 are generic fusebanks that advantageously enable optimum utilization of available fusebanks. It is this optimum utilization that allows designers the ability to provide less chip space consuming fuses while still providing the main memory array block 210 with substantially the same repairability of prior art designs.

Figure 2B:
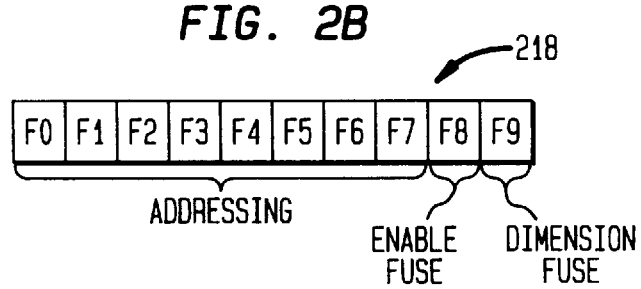
FIG. 2B illustrates an exemplary programmable fusebank having a plurality of fuses that may be coded to be row or column specific in accordance with one embodiment of the present invention.

FIG. 2B illustrates an exemplary programmable fusebank 218 having a plurality of fuses that may be programmed using a programming laser in accordance with one embodiment of the present invention. As shown, the programmable fusebank 218 contains eight addressing fuses (F0–F7) that are used to select a row or column address within the main memory array block 210 that will be replaced with a redundant row or column element. Although the main memory array block 210 may have any size or shape depending on an integrated circuit's memory requirements, assume that 256 rows and 64 columns are provided within the main memory array block 210 of FIG. 2A.

Therefore, in order to address the 256 rows within the main memory array block 210, the addressing fuses of the programmable fusebank 218 have at least eight addressing fuses (i.e., $2^8=256$), or at least six fuses (i.e., $2^6=64$) to address the columns within the main memory array block 210. Accordingly, to accommodate both row and column addressing within a single programmable fuse bank 218, it is desirable that there be at least enough addressing fuses to program the largest number of rows or columns in a selected memory array block. By way of example, if a selected memory array block contains 512 rows and 128 columns, then there should be at least nine (i.e., $2^9=512$) addressing fuses to enable proper replacement of a row element within the memory array. Accordingly, if nine addressing fuses are provided to accommodate the 512 rows, then there will be enough addressing fuses to accommodate the seven fuses (i.e., $2^7=128$) needed to address the 128 columns in the memory array block.

It should therefore be borne in mind that the eight addressing fuses illustrated in FIG. 2B are merely exemplary, and any number of addressing fuses may be provided as part of the programmable fusebank 218 to accommodate the size of the main memory array block 210. Further, although the present discussion is focused on replacing entire elements when a cell defect is detected, it is also possible to replace only selected parts of a defective element by performing more specific addressing.

The programmable fusebank 218 also includes an "enable fuse" to signify that replacement of a selected address in the main memory array block 210 with a redundant element is proper. For more information on the implementation and use of enable fuses in typical dynamic random access memory (DRAM) chips, reference may be made to a co-pending application entitled "Improved Redundant Circuits and Methods Therefor," filed on Jun. 20, 1997, having Ser. No. 08/879,726 (Attorney Docket No. 97P7495US/SMNJP005), which is hereby incorporated by reference for all purposes.

The programmable fusebank 218 in accordance with one embodiment of the present invention also includes a "dimension fuse" which enables the flexible application of the programmable fusebank 218 to either a row or a column of the main memory array block 210. It should be appreciated that by providing a programmable fusebank 218 that is neither row or column-specific allows a reduction in the number of fusebanks needed to implement repairs in the main memory array block 210 with the set of redundant column elements 214 and the set of redundant row elements 212. In other words, by eliminating the need to have row or column-specific fusebanks, it is possible to use only about half as many fusebanks to effectuate anticipated repairs in a typical main memory array block.

Figure 1A:
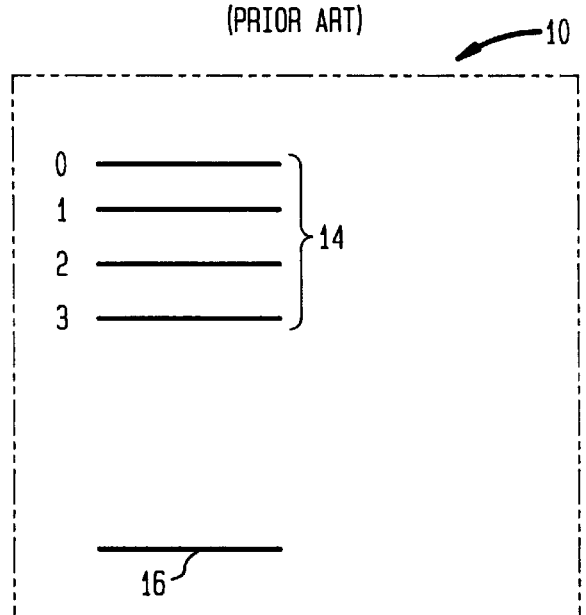
FIG. 1A illustrates the use of a redundant element that may be used to replace a main array element.
Figure 1B:
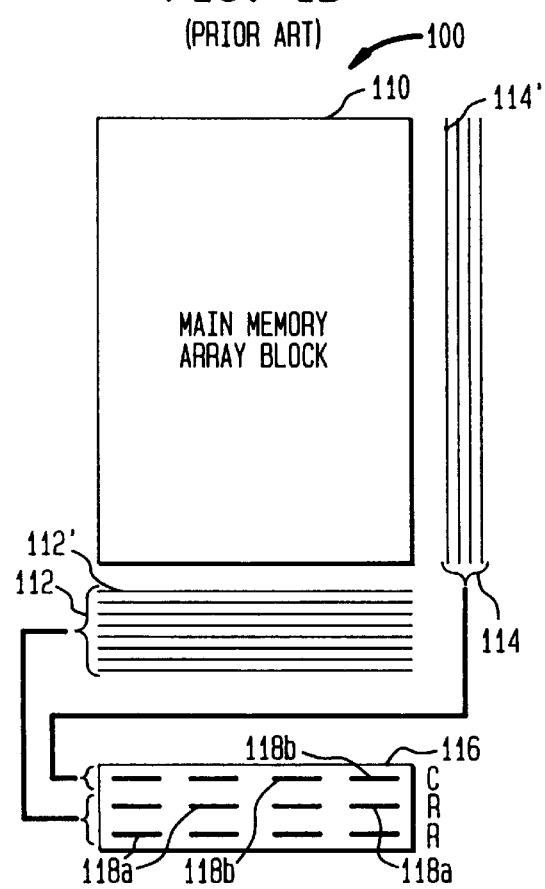
FIG. 1B shows an independently repairable memory block having a number of redundant row and column elements.

To illustrate the effective reduction in the number of physical fusebanks needed to effectuate appropriate repairs in a main memory array block, twelve fusebanks were needed in the prior art design shown in FIG. 1B. More specifically, four fusebanks 118b were needed for column addressing, and eight fusebanks 118a were needed for row addressing. However, because only six fusebanks are provided within the compact fusebank group 216, the chip area previously occupied by the other six fusebanks may now be used to reduce the chip size or route miscellaneous integrated circuit logic. In one embodiment, the six programmable fusebanks 218 may now be used to replace either a row or column in the main memory array block 210 with the set of redundant row elements 212 and the set of redundant column elements 214. As such, six redundant elements are provided in each of the sets of redundant elements 212 and 214 to accommodate a case where all six programmable fuse banks 218 are used to replace only row or only column elements.

As mentioned above, the reduction in the number of fusebanks has substantial beneficial effects in reducing the chip size needed to lay out each of the independently repairable block 200. Further, the additional chip space that is furnished by the fewer number of fusebanks may also be used to implement circuit logic, which is typically to blame for increasing chip size.

Figure 3:
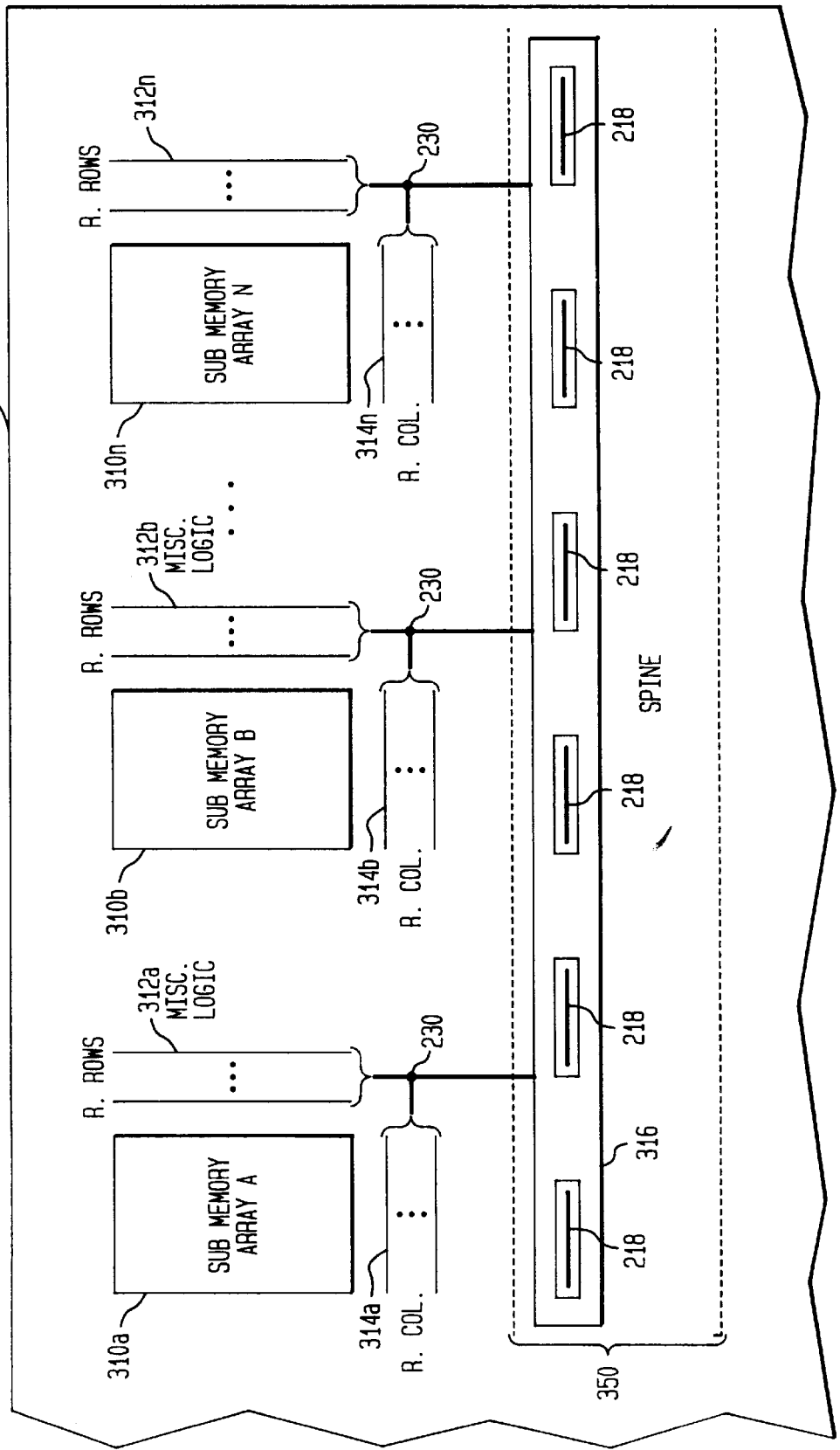
FIG. 3 illustrates a semiconductor device having a main memory array block that is spread out among a number of physical sub-memory arrays in accordance with an alternative embodiment of the present invention.

FIG. 3 illustrates a semiconductor device 300 having a main memory array block that is spread out among a number of physical sub-memory arrays in accordance with one embodiment of the present invention. In this embodiment, the main memory array block 210 of FIG. 2A has been partitioned and laid out among miscellaneous logic that may be used throughout the semiconductor device 300. As mentioned above, there is often a need to repair failed cells within the sub-memory arrays during the manufacture and testing of memory devices. As in the case of a consolidated memory array block 210, each of the sub-memory arrays 310a, 310b, and 310n, are furnished with associated redundant column elements 314a and redundant row elements 312a to replace elements within an associated sub-memory array having a failed cell.

As shown, the semiconductor device 300 may have a spine region 350 in which an aligned fusebank group 316 may be laid out in any arrangement to effectuate the best density improving wire routing achievable to selected redundant row elements and redundant column elements. It should be understood that the "spine" region 350 refers to a non-memory array region on the chip that may be used for wire routing, layout of miscellaneous logic, and fusebank layout. Furthermore, memory chips are also typically divided by non-memory array "belt" regions (not shown) that are generally perpendicular to the spin region 350. These belt regions are also typically available for wire routing, layout of miscellaneous logic, and fusebank layout.

As in the embodiment of FIG. 2B, each of the programmable fusebanks 218 are provided with addressing fuses, an enable fuse, and a dimension fuse to identify whether the programmable fusebank 218 should be used to address a failed column element or a failed row element within each of the sub-memory arrays 310a, 310b, and 310n. By way of example, assuming that one of the programmable fusebanks 218 has been programmed to repair a failed column element within one of the sub-memory arrays, then a redundant column element 314a, 314b, and 314n will be simultaneously replaced in each of the sub-memory arrays. The simultaneous replacement of the failed column with the redundant column element 314a, 314b, and 314n occurs because the consolidated memory array block was partitioned into the sub-memory arrays.

However, when the dimension fuse of the programmable fusebank 218 is programmed to replace a row element of one of the sub-memory arrays, then only one redundant row element will be used to replace a row within one of the sub-memory arrays 310a, 310b, or 310n. It should also be appreciated that the ability to arrange the programmable fusebanks in any manner which assists in improving layout density may be practiced. Therefore, the illustrated aligned arrangement of the programmable fusebanks 218 may also be laid out over any part of the semiconductor device 300 to assist in improving density. In this manner, if logic devices are needed to complete an integrated circuit in the semiconductor device 300, more of the spine region 350 may be used since fewer programmable fusebanks 218 occupy that space.

In another embodiment, it may be possible to layout all of the redundant rows, columns and fusebanks away from the memory arrays. By way of example, a redundant memory array that includes redundant columns and redundant rows may be laid out in the aforementioned spine region 350 or in the belt region. In addition, fusebanks may also be laid out in any non-memory part of a device. It should therefore be appreciated that the dimension programmable fusebanks provide designers with more flexibility with respect to laying out memory arrays and fusebanks in the most space efficient manner while leaving fewer fusebanks unused. As mentioned earlier, price competition in memory devices, such as DRAM memory devices is very intense, and each percent of wasted chip space may translate into millions of dollars in lost profits due to fewer chips being manufactured from each semiconductor wafer.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A repairable semiconductor memory array, comprising:

main memory array;

a set of redundant rows and a set of redundant columns for repairing a row element or a column element of the main memory array; and a plurality of fusebanks, each of the plurality of fusebanks being programmable to address one of the column element and the row element of the main memory array, the addressed one of the column element and the row element being replace one row of the set of redundant; rows or one column of the set of redundant columns, wherein each fusebank in the plurality of fusebanks has a dimension fuse that is programmed to select the address of the one of the column element and the row element for replacement.

2. A repairable semiconductor memory array as recited in claim 1, wherein the plurality of fusebanks are arranged in a fusebank group that is electrically wired to the set of redundant rows and the set of redundant columns.

3. A repairable semiconductor memory array as recited in claim 2, wherein each of the plurality of fusebanks includes a plurality of addressing fuses for programming the address of the main memory array.

4. A repairable semiconductor memory array as recited in claim 3, wherein each of the plurality of fusebanks includes an enable fuse for enabling the selection of the address programmed into the addressing fuses.

5. A repairable semiconductor memory array as recited in claim 4, wherein the fusebank group is electrically coupled to the set of redundant rows and the set of redundant columns at a selection node.

6. A repairable semiconductor memory array as recited in claim 3, wherein the main memory array has n-row elements and m-column elements.

7. A repairable semiconductor memory array as recited in claim 3, wherein the main memory array is a dynamic random access memory array.

8. A method for making a repairable semiconductor memory array, comprising:

providing a main memory array having a plurality of row elements and a plurality of column elements;

providing a plurality of redundant row elements and a plurality of redundant column elements for repairing a failed one of the plurality of row elements and the plurality of column elements; and replacing an addressed one of either the plurality of column elements and the plurality of row elements of the main memory array with at least one of the redundant rows and the redundant columns, the addressed one being selected by programming a fusebank that is wired to both the plurality of redundant row elements and the plurality of redundant column elements, wherein the fusebank in programmed by coding a dimension fuse that selects the replacement of the one of either the plurality of column elements and the plurality of row elements of the main memory array.

9. A method for making a repairable semiconductor memory array as recited in claim 8, wherein the a plurality of redundant row elements and a plurality of redundant column elements are both coupled to the fusebank.

10. A method for making a repairable semiconductor memory array as recited in claim 9, wherein the fusebank includes a plurality of addressing fuses for programming an address of the main memory array.

11. A method for making a repairable semiconductor memory array as recited in claim 10, wherein the fusebank includes an enable fuse for enabling the selection of the address programmed into the addressing fuses.

12. A repairable memory array including a main memory array, a set of redundant row elements and a set of redundant column elements for repairing selected row and column elements of the main memory array, comprising;

a fusebank group means being electrically coupled to the set of redundant rows and the set of redundant columns; and a plurality of fusebank means contained within the fusebank group means, each of the plurality of fusebank means being programmable to address one of the column elements and the row elements of the main memory array, the addressed one of the column elements and the row elements being bypassed with one of the set of redundant row elements and the set of redundant column elements, wherein each of the plurality of fusebank means have a dimension fuse that is programmed to select the address of the one of the column element and the row element for replacement.

13. A repairable memory array as recited in claim 12, wherein each of the plurality of fusebank means include a plurality of addressing fuse means for programming the address of the main memory array.

14. A repairable memory array as recited in claim 13, wherein the main memory means is a random access memory.

15. A repairable memory array as recited in claim 13, wherein the main memory means is a dynamic random access memory.

* * * * *